(12) United States Patent
Courau

(10) Patent No.: US 6,879,205 B2
(45) Date of Patent: Apr. 12, 2005

(54) PROCESS FOR CONTROLLING THE IMPEDANCE OF AN OUTPUT AMPLIFICATION SEMICONDUCTOR DEVICE AND CORRESPONDING OUTPUT AMPLIFYING DEVICE

(75) Inventor: Lionel Courau, Grenoble (FR)

(73) Assignee: STMicroelectronics S.A. (FR)

( * ) Notice: Subject to any disclaimer, the term of this patent is extended or adjusted under 35 U.S.C. 154(b) by 0 days.

(21) Appl. No.: 10/420,543

(22) Filed: Apr. 21, 2003

(65) Prior Publication Data

US 2004/0012434 A1 Jan. 22, 2004

(30) Foreign Application Priority Data

Apr. 22, 2002 (FR) .............................. 02 05003

(51) Int. Cl.[7] .............................................. H03K 17/16
(52) U.S. Cl. ........................ 327/391; 327/112; 326/30
(58) Field of Search ................................ 327/112, 334, 327/391, 403, 427, 434, 437, 562, 108; 326/85, 87, 30, 82–83

(56) References Cited

U.S. PATENT DOCUMENTS

| | | | | |
|---|---|---|---|---|
| 6,127,857 A | * | 10/2000 | Ogawa et al. ................. 327/94 |
| 6,194,913 B1 | * | 2/2001 | Verkinderen et al. ......... 326/83 |
| 6,225,844 B1 | * | 5/2001 | Fujiwara ....................... 327/170 |
| 6,310,519 B1 | | 10/2001 | Ross ............................. 330/289 |
| 6,313,659 B1 | | 11/2001 | Bosnyak et al. .............. 326/30 |
| 6,326,821 B1 | * | 12/2001 | Gabara ......................... 327/112 |
| 6,351,149 B1 | * | 2/2002 | Miyabe ......................... 326/87 |
| 6,642,742 B1 | * | 11/2003 | Loyer ............................ 326/30 |
| 6,759,868 B2 | * | 7/2004 | Helt et al. ..................... 326/30 |
| 2002/0003441 A1 | | 1/2002 | Steensgaard-Madsen ..... 327/54 |

FOREIGN PATENT DOCUMENTS

EP    1 020 989    7/2000

OTHER PUBLICATIONS

French Search Report, FA 617687/FR 0205005, dated Mar. 19, 2003.

* cited by examiner

Primary Examiner—My-Trang Nu Ton
(74) Attorney, Agent, or Firm—Jenkens & Gilchrist, PC

(57) ABSTRACT

An output buffer includes a pair of main complimentary MOS transistors connected to at least one additional pair of complementary MOS transistors connected in parallel to the pair of main transistors by means of a pair of switches controlled by a numeric word for activating or not activating the additional pair of transistors. A control circuit delivers the numeric word which represents the conductivity of the pair of main transistors included in the output buffer. The additional transistors are sized in such a way that when they are activated, the equivalent impedance of the output buffer is approximately constant.

24 Claims, 3 Drawing Sheets

PROCESS FOR CONTROLLING THE IMPEDANCE OF AN OUTPUT AMPLIFICATION SEMICONDUCTOR DEVICE AND CORRESPONDING OUTPUT AMPLIFYING DEVICE

CROSS-REFERENCES

This application claims priority from French Application for Patent No. 0205003 filed on Apr. 22, 2002, the disclosure of which is hereby incorporated by reference.

BACKGROUND OF THE INVENTION

1. Technical Field of the Invention

The present invention relates to integrated circuit output amplifiers and, more particularly, but not by way of limitation, embodiments of the present invention relate to a complimentary metal oxide semiconductor (CMOS) technology output amplifier with an output stage impedance that is variable as a function of the environmental parameters of the amplifier's constituent CMOS transistors.

2. Description of Related Art

An output amplifier is used to transmit electrical signals outwards from a circuit. Generally, signals are supplied to electrical conductors (pins, tracks) that can assimilate inductive and capacitive loads. The function of the output amplifier is mainly to adapt the signal emitted outwards from the circuit to a power line receiving the signal.

An amplifier output stage conventionally includes a pair of complementary (buffer) MOS transistors forming an output stage.

The output stage impedance varies considerably as a function of the environment parameters of the transistors such as the temperature, the supply voltage and the silicon manufacturing conditions (in-silicon manufacturing process). Two important consequences derive from this.

The first lies in the fact that the integrity of the output signal may be degraded, given the difference in impedance between the power line receiving the signal and the output stage.

The second lies in the fact that, when the transistors are fast, the maximum current peak is much larger, which generates excessive noise on the power supply terminals.

Embodiments of the present invention provide a solution to the aforementioned problems.

SUMMARY OF THE INVENTION

An embodiment according to the principles of the present invention controls the output amplifier impedance by limiting the variation in the output stage impedance as a function of its temperature, the supply voltage and the in-silicon manufacturing conditions. All of the above mentioned conditions depend on the sequence of stages in the manufacture of integrated circuits.

An embodiment according to the principles of the present invention therefore describes an output amplification semiconductor device having an output stage comprising at least two main complementary MOS transistors.

According to one embodiment of the present invention, the device may additionally include a control circuit that delivers a numeric word representing the conductivity of the main MOS transistors. For example, the numeric word may represent the current that the main transistors are able to supply. The intrinsic conductivity of the main transistors also changes as a function of the temperature, the supply voltage value and the quality of the in-silicon manufacturing conditions of the transistors.

Furthermore, the output stage additionally comprises at least one additional pair of complementary MOS transistors connected in parallel to the pair of main transistors by at least one pair of switches controlled by the numeric word for activating or not activating the at least one additional pair of transistors.

In this way, according to the principles of the present invention, the output stage is composed of at least two output buffers, with the main transistors being always active.

Although the impedance may already be controlled using the at least one additional pair of output transistors, it is preferable for the output stage to include a plurality of additional pairs of complementary MOS transistors connected in parallel to the pair of main transistors by a plurality of switches also controlled by the numeric word for selectively activating or not activating the plurality of additional pairs of transistors.

In this way, a numeric word may for example be used which has a number of bits equivalent to the number of additional buffers, with each bit controlling the pair of switches associated with an additional buffer.

In other words, the control circuit sends a code on a certain number of bits corresponding to the operating conditions of output stage CMOS transistors. Depending on this code value, the transistors may be considered as "slow" (the intrinsic conductivity of the current the transistors are able to supply is low), or conversely be considered as "fast", (having high intrinsic conductivity such that they are able to supply heavy currents). The "speed" of the transistors may also assume discrete intermediate values between the two extreme values.

The additional output buffers may be activated selectively as a function of the code value. Thus, as an example, each code bit may be associated with an output buffer, the latter being activated according to the logic value of this bit.

According to another embodiment of the present invention, the additional transistors are sized such that when they are activated, the equivalent impedance of the output stage is approximately constant. For example, approximately equal to the minimum impedance of the main transistors.

According to yet another embodiment of the present invention, the control circuit may include a variable current source supplying a current that is variable as a function of the environmental parameters of the device, a constant current source supplying a current that is approximately constant whatever the values of these environmental parameters, and comparison means between these two currents able to deliver the same numeric word.

Yet another embodiment of the present invention includes an integrated circuit having an output amplification semiconductor device as defined above.

Another embodiment of the present invention includes a process for controlling the impedance of an output amplification semiconductor device, including an output stage comprising main complementary MOS transistors.

According to still another embodiment of the present invention, a numeric word may be developed which represents the intrinsic conductivity of the main MOS transistors, and at least one additional pair of complementary MOS transistors may be connected or not connected in parallel to the pair of main transistors as a function of the numeric word value. For example, the additional transistors may be sized in such a way that when they are actually connected, the equivalent impedance of the output stage is approximately equal to the minimum impedance of the main transistors.

Yet another embodiment of the present invention may include the plurality of additional pairs of complementary MOS transistors which are selectively connected or not connected in parallel to the pair of main transistors as a function of the numeric word value.

According to still another embodiment of the present invention, the numeric word development stage may include the generation of a variable current that is variable as a function of the environment parameters of the device, the generation of a constant current that is constant whatever the values of these environment parameters, and a comparison between the two currents.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
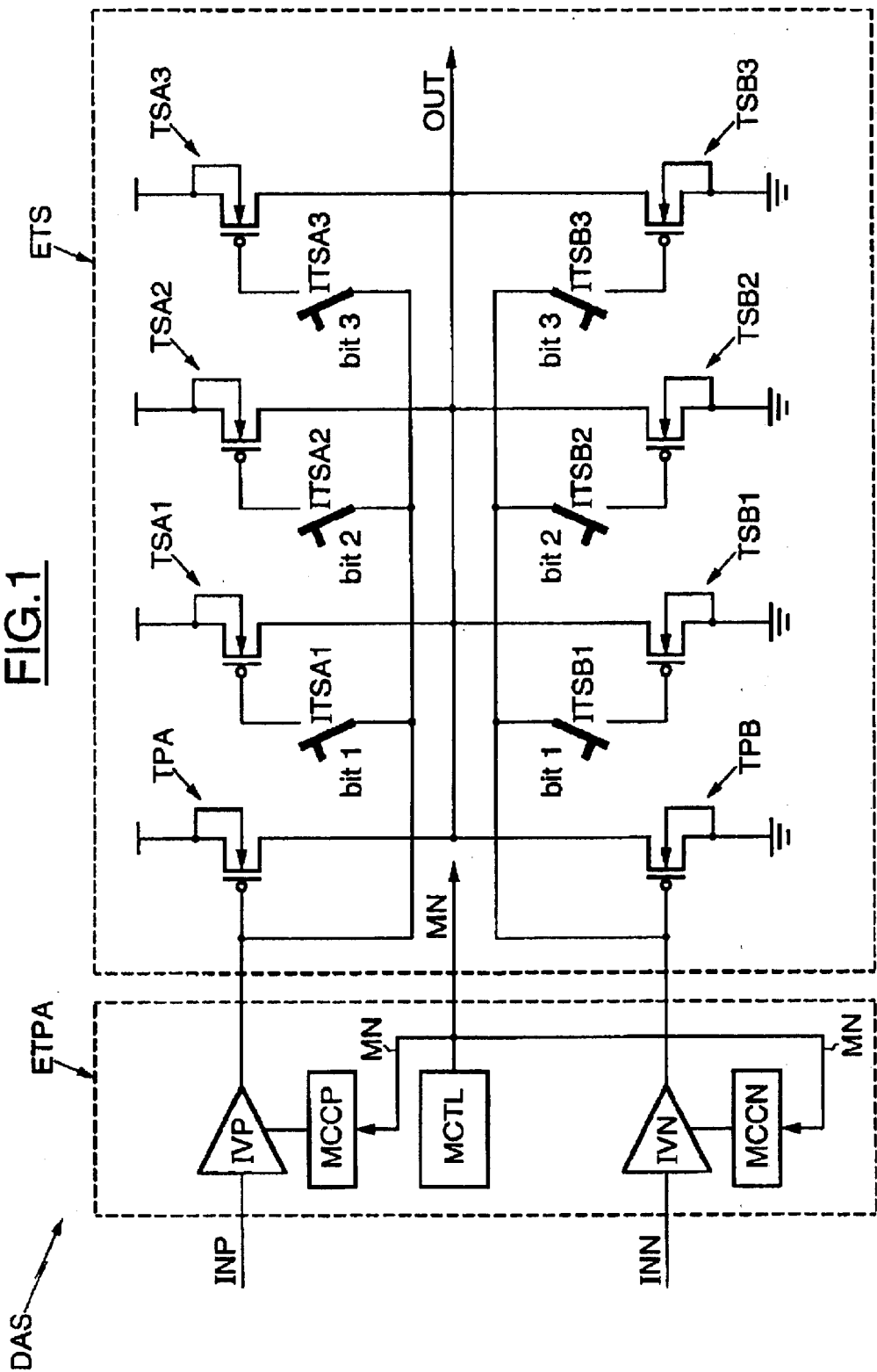
FIG. 1 illustrates an embodiment of an output amplifier device, according to the principles of the present invention.

Referring now to FIG. 1, DAS may be an integrated circuit output amplifier intended to drive a generally capacitive load. The DAS amplifier may include an output stage ETS having a main output buffer formed of two main complementary MOS transistors, TPA and TPB.

The main transistor TPA is a p-channel MOS transistor connected between a supply terminal Vdd and an output terminal OUT. The main transistor TPA is controlled by the output of an inverter IVP belonging to a pre-amplification stage ETPA.

The TPB main transistor may be an n-channel MOS transistor connected between the output terminal OUT and a ground. The transistor TPB is controlled by the output of an inverter IVN. The inputs of the inverters IVP and IVN may be connected to an input terminals INP and INN respectively.

Apart from the main transistors TPA and TPB, the output stage ETS comprises a plurality of additional output buffers (only three are shown by way of example in FIG. 1), each composed of at least two additional complementary MOS transistors TSAi and TSBi (i=1, 2, . . . ).

Each of the at least two additional pair of transistors TSAi and TSBi may be connected in parallel to the pair of main transistors TPA and TPB, by a pair of switches ITSAi and ITSBi (i=1, 2, . . . ).

Specifically, the gate of each of the at least two additional transistors may be connected to the corresponding main transistor by the corresponding switch. In this way, each of the additional pair of transistors TSAi or TSBi may be activated or deactivated. For example, connected or not connected in parallel to the corresponding main transistor as a function of the closing or opening of the pair of switches. In practice, the pair of switches may be formed of transistors controlled on their gates and able to assume an off-state (switch open) or an on-state (switch closed).

The pair of switches may be controlled by bits (in the embodiment illustrated in FIG. 1, three bits) of a numeric word MN, delivered by control circuit MCTL. The pair of switches may be closed when the corresponding bit of the numeric word is at 0 (low) and may be open when the corresponding bit is at 1 (high). Although the control circuit MCTL is illustrated in FIG. 1 for the purposes of simplification within the pre-amplifying stage ETPA, in practice MCTL may be placed at another place in the integrated circuit.

Figure 2:
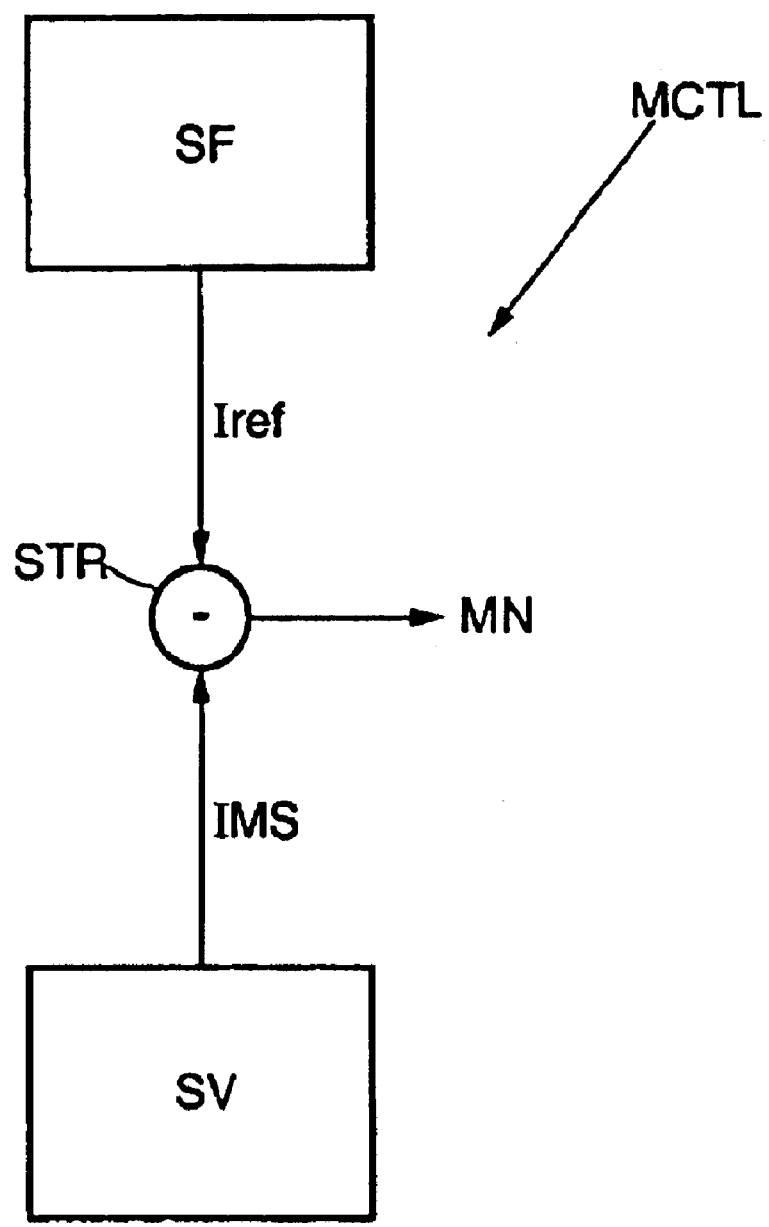
FIG. 2 illustrate an embodiment of the control circuit of a device, according to the principles of the present invention.
Figure 3:
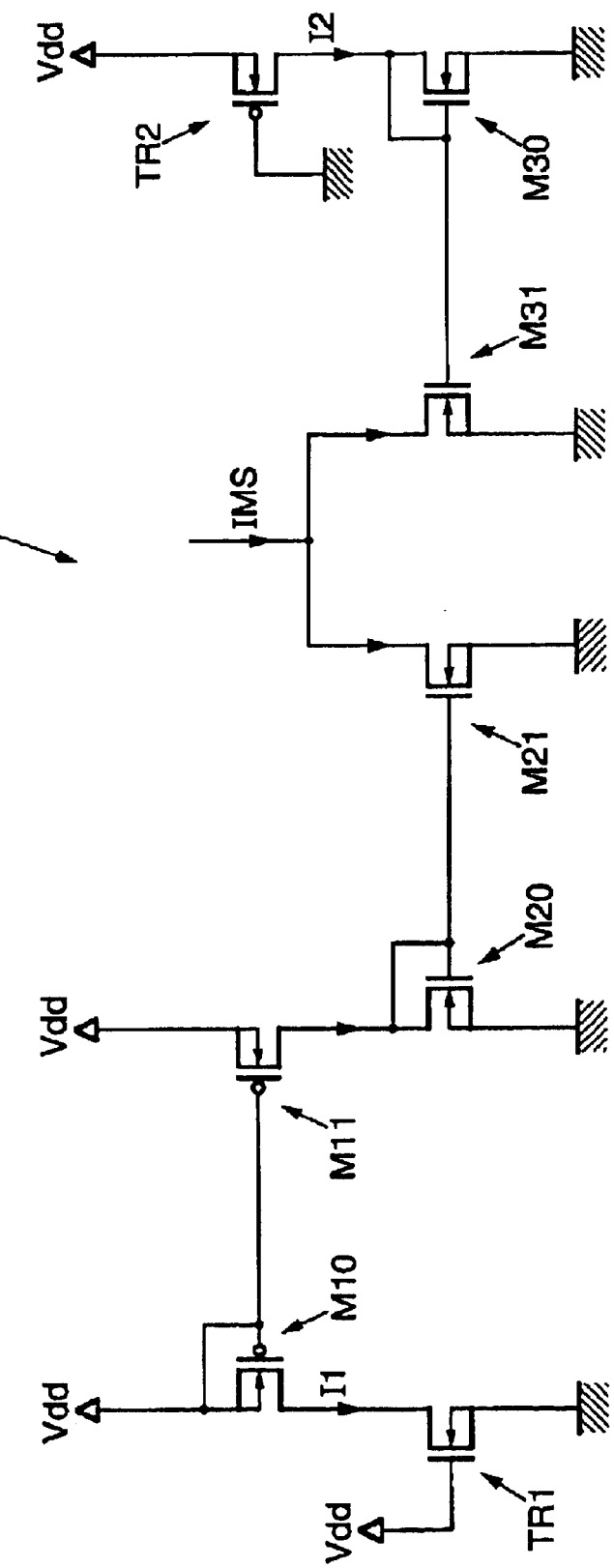
FIG. 3 illustrates embodiments of different parts of the control circuit of FIG. 2.

Referring now to FIGS. 2 and 3, in combination, a more detailed description is given of the control circuit MCTL according to the principles of the present invention.

The control circuit MCTL includes a current source SF supplying a current Iref which is approximately constant and independent of the circuit environmental parameters, such as the temperature, the supply voltage and/or the quality of the circuit transistors. Such a current source may, for example, be a band gap generator.

Furthermore, a variable current source SV supplies a measuring current IMS representing the intrinsic conductivity of MOS transistors. The IMS current varies as a function of the variations in the circuit environmental parameters.

A comparison means STR, of conventional structure and including an analog divider followed by an analog-to-digital converter, supplies the relationship between the current Iref and the current IMS and consequently delivers the numeric word MN.

In FIG. 3, the variable current source SV includes an NMOS measuring transistor TR1 which is equivalent to the NMOS transistor TPB and mounted in FIG. 3 as an NMOS type current source.

Furthermore, the variable current source SV comprises a PMOS measuring transistor TR2 which is equivalent to the PMOS transistor TPA, and also mounted as a PMOS type current source.

The drain current I1 of the transistor TR1 is copied by a first PMOS type current mirror, M10 and M11, then by a second NMOS type current mirror, M20 and M21.

Likewise, the drain current I2 of the transistor TR2 is copied by a third current mirror M30 and M31.

A mean value of the two current sources TR1 and TR2 is consequently obtained, and the average measured current IMS may be a current that is variable as a function of the temperature, the supply voltage and/or as a function of the manufacturing process, whether for NMOS transistors or for PMOS transistors. The current IMS may further be representative of the conductivity of the NMOS and PMOS transistors TR1 and TR2.

Thus, when the environment parameters vary in such a way that the intrinsic conductivity of the MOS transistors TR1 and TR2 increases, the variable IMS current increases.

With reference to FIGS. 1, 2, and 3, a more detailed description is given below of the operation of an embodiment according to the principles of the present invention.

For example, a numeric word MN having all the bits at 0 represents transistors may be considered as "slow". In other words, their intrinsic conductivity is low and the currents that the transistors are capable of supplying are minimal. This represents high impedance.

Conversely, when all the bits of the numeric word are at 1, the transistors may be then considered as "fast". The intrinsic conductivity is high and the transistors are capable of supplying large currents. The output stage impedance is then at a minimum.

The increase in impedance is expressed by the activation of additional buffers (transistors TSBi and TSAi).

One skilled in the art knows that the impedance of a transistor is linked to its size or the W/L ratio, where W and L denote channel width and length, respectively.

To retain the most stable output impedance, whatever the temperature, supply voltage and/or process conditions, the size of the additional transistors TSBi and TSAi may be defined in such a way that when TSBi and TSAi are activated, the equivalent output stage impedance remains approximately constant.

The "fastest" scenario will have only the main transistors TPA and TPB activated (all the bits of the numeric word MN are at 1).

Zmin denotes the impedance of the transistor TPA (and TPB) in the fastest scenario, and Zmax the impedance of the transistor TPA (and TPB) in the case where the environment conditions are such that the bit 1 of the numeric word is close to its transition.

When the bit 1 passes to the low state, such that bit 1 assumes the logic value 0, the transistors TSA1 and TSB1 are in the on-state. The size of TSA1 and TSB1 are determined in such a way that when TSA1 and TSB1 are activated, the equivalent impedance of the pair of activated transistors TPA and TSA1 (and TPB and TSB1) is equal to Zmin.

Likewise when the bit 2 passes to the low state (bit 1 being still in the low state), the transistors TSA1 and TSB1 are in the on-state. The size of TSA1 and TSB1 are determined in such a way that when they are activated, the equivalent impedance of the activated transistors TPA, TSA1, TSA2 (and TPB, TSB1, and TSB2 respectively) is equal to Zmin, and so on as the numeric word bits assume one after the other the value 0.

Embodiments of the present invention therefore make it possible, by using particularly a numeric word allowing technological dispersion to be reduced, to stabilize the output impedance value.

Additionally, this numeric word may be used in a device MCCP connected to the inverter IVP, and in a device MCCN connected to the inverter IVN, which establishes adjustable current proportional to the numeric word MN, so as to act on the amplifier switching speed.

Such devices MCCP and MCCN are known to one skilled in the art and are described in international patent application number WO 00/05818 which is incorporated herein by reference.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An output amplification semiconductor device having an output stage comprising:
    at least two main complementary MOS transistors;
    a control circuit that delivers a numeric word representing the conductivity of the at least two main MOS transistors;
    at least two switches connected to receive the numeric word; and
    at least two additional complementary MOS transistors connected in parallel to the at least two main transistors by the at least two switches, wherein the at least two switches are controlled by the numeric word for activating or not activating the at least two additional transistors.

2. The device according to claim 1, wherein the at least two additional transistors have a size such that when they are activated, the equivalent impedance of the output stage is approximately constant.

3. The device according to claim 1, wherein the control circuit comprises:
    a variable current source supplying a current that is variable as a function of the environment parameters of the device;
    a constant current source adapted for supplying a current that is approximately constant whatever the values of the environment parameters; and
    means for comparing the currents of the variable and constant current sources and transmitting the numeric word based on that comparison.

4. The device according to claim 1 wherein the device is an integrated circuit.

5. A process for controlling the impedance of an output amplification semiconductor device having an output stage comprising at least two main complementary MOS transistors comprising the steps of:
    developing a numeric word value representing the intrinsic conductivity of the at least two main MOS transistors; and
    coupling at least two additional complementary MOS transistors in parallel to the at least two main transistors as a function of the numeric word value.

6. The process according to claim 5, wherein the step of coupling the additional transistors further comprises the step of sizing the at least two additional transistors and the at least two main transistors such that when they are coupled, the equivalent impedance of the output stage is approximately constant.

7. The process according to claim 5, wherein the step of developing the numeric word further comprises the steps of:
    developing a variable current that varies as a function of the environment parameters of the device;
    developing a constant current that is approximately constant whatever the values of these environment parameters; and
    comparing the variable and constant currents.

8. A device for controlling the impedance of an output amplifier, comprising:
    at least one main output buffer;
    at least one additional output buffer; and
    control circuitry operable to maintain the impedance of the output amplifier at a substantially constant value by developing a numeric word representing the intrinsic conductivity of the main output buffer and selectively coupling the at least one additional output buffer in parallel to the at least one main output buffer as a function of the numeric word.

9. The device according to claim 8, wherein the at least one main output buffer further comprises:
    a PMOS main transistor coupled between a voltage source and an output node; and
    an NMOS main transistor coupled between the output node and a reference node.

10. The device according to claim 9, wherein the at least one additional output buffer further comprises:
    a PMOS additional transistor selectively coupled in parallel with the PMOS main transistor; and
    an NMOS additional transistor selectively coupled in parallel with the NMOS main transistor.

11. The device according to claim 10, wherein the NMOS and PMOS additional transistors have a size such that when the at least one additional buffer is coupled in parallel with the at least one main buffer the impedance of the output amplifier remains substantially constant.

12. The device according to claim 11, wherein the control circuitry further comprises:
    a variable current source operable to supply a current that varies with environmental conditions;
    a constant current source operable to supply a constant current;
    a plurality of switches adapted for coupling the NMOS and PMOS main transistors in parallel with the NMOS and PMOS additional transistors; and circuitry operable to generate the numeric word responsive to a comparison of the variable and constant currents;

wherein the numeric word is operable to close the plurality of switches, thereby coupling the NMOS and PMOS additional transistors in parallel with the NMOS and PMOS main transistors.

13. The device according to claim 12, wherein the variable current source further comprises:

an NMOS measuring transistor having dimensions and properties approximately equal to the NMOS main transistor which generates a first drain current; and a PMOS measuring transistor having dimensions and properties approximately equal to the PMOS main transistor which generates a second drain current;

wherein a mean value of the combination of the first and second drain currents produces the variable current.

14. The device according to claim 13, wherein the output amplifier is integrated in a semiconductor package.

15. A method for controlling the impedance of an output amplifier having at least one main output buffer and at least one additional output buffer, comprising the steps of:

determining a conductivity of the at least one main output buffer; and selectively coupling the at least one additional output buffer in parallel with the at least one main output buffer based upon the value of the determined conductivity;

wherein the step of determining the conductivity further comprises the step of generating a numeric word signal representing the conductivity of the at least one main output buffer.

16. The method according to claim 15, wherein the step of generating the numeric word signal further comprises the steps of:

generating a variable current indicative of the conductivity of the at least one main output buffer;

supplying a constant reference current;

comparing the constant reference current with the variable current; and generating the numeric word based on the comparison of the constant reference current with the variable current.

17. The method according to claim 16, wherein the step of selectively coupling the at least one additional output buffer further comprises the step of selectively coupling the at least one additional output buffer in parallel with the at least one main buffer so as to maintain a substantially constant output amplifier impedance.

18. An output amplification semiconductor device having an output stage comprising:

at least two main complementary MOS transistors;

a control circuit that delivers a control signal;

at least two switches connected to receive the control signal; and at least two additional complementary MOS transistors connected in parallel to the at least two main transistors by the at least two switches, wherein the at least two switches are controlled by the control signal for activating or not activating the at least two additional transistors.

19. The device according to claim 18, wherein the at least two additional transistors have a size such that when they are activated, the equivalent impedance of the output stage is approximately constant.

20. The device according to claim 18, wherein the control circuit comprises:

a variable current source supplying a current that is variable as a function of the environment parameters of the device;

a constant current source adapted for supplying a current that is approximately constant whatever the values of the environment parameters; and means for comparing the currents of the variable and constant current sources and transmitting the control signal based on that comparison.

21. The device according to claim 18 wherein the device is an integrated circuit.

22. An output amplifier, comprising:

a main output buffer;

at least one additional output buffer, the main and at least one additional output buffers sharing a common output;

a switching circuit that selectively couples the main output buffer and at least one additional output buffers to additionally share a common input; and a control circuit connected to the switching circuit that generates a control signal representing the intrinsic conductivity of the main output buffer, the control sianal being applied to the switching circuit such that the selective coupling is made in response to the intrinsic conductivity.

23. A process for controlling the impedance of an output amplification semiconductor device having an output stage comprising a first and second pair of complementary MOS transistors, comprising the steps of:

developing a numeric word signal representing the intrinsic conductivity of the first pair of complementary MOS transistors; and selectively coupling the second pair of complementary MOS transistors to the first pair of complementary MOS transistors such that the pairs share common inputs and outputs in response to the numeric word signal.

24. A device for controlling the impedance of an output amplifier, comprising:

a first output buffer;

a second output buffer; and control circuitry operable to maintain the impedance of the output amplifier at a substantially constant value by developing a numeric word representing the intrinsic conductivity of the first output buffer and selectively coupling the first output buffer to the second output buffer as a function of the numeric word in a parallel configuration where the first and second output buffers share common inputs and outputs.

* * * * *

UNITED STATES PATENT AND TRADEMARK OFFICE
CERTIFICATE OF CORRECTION

PATENT NO.    : 6,879,205 B2
DATED         : April 12, 2005
INVENTOR(S)   : Lionel Courau It is certified that error appears in the above-identified patent and that said Letters Patent is hereby corrected as shown below:

Column 8,
Line 30, replace "control sianal" with -- control signal --.

Signed and Sealed this

Twenty-second Day of November, 2005

JON W. DUDAS
*Director of the United States Patent and Trademark Office*